United States Patent
Koeth et al.

[11] Patent Number: 5,423,558
[45] Date of Patent: Jun. 13, 1995

[54] SEMICONDUCTOR WAFER CARRIER AND METHOD

[75] Inventors: Joe E. Koeth, Mesa; Melvin J. Hoffman; Paul D. Jackson, both of Scottsdale, all of Ariz.

[73] Assignee: IPEC/Westech Systems, Inc., Phoenix, Ariz.

[21] Appl. No.: 216,848

[22] Filed: Mar. 24, 1994

[51] Int. Cl.⁶ .............................................. B25D 11/00
[52] U.S. Cl. ........................................ 279/3; 269/21; 451/289; 451/388
[58] Field of Search .............. 279/3; 269/21; 451/289, 451/388; 204/298.15

[56] References Cited

U.S. PATENT DOCUMENTS

| | | | |
|---|---|---|---|
| 3,711,081 | 1/1973 | Cachon | 269/21 |
| 3,833,230 | 9/1974 | Noll | 269/21 |
| 4,194,324 | 3/1980 | Bonora et al. | 279/3 |
| 5,172,922 | 12/1992 | Kowalwski et al. | 279/3 |

FOREIGN PATENT DOCUMENTS 0172642  7/1990  Japan .................................. 269/21

Primary Examiner—Steven C. Bishop
Attorney, Agent, or Firm—Harry M. Weiss

[57] ABSTRACT

An improved semiconductor wafer carrier provides gimballing motion of the wafer to dynamically align the wafer to a polishing platen. This gimballing motion is achieved by providing a conical receptacle which has a spring friction fit with a spherical button. A torque plate with spring fingers provides the spring friction fit between the conical receptacle on the rotating shaft and the spherical button on the drive plate of the wafer carrier.

20 Claims, 2 Drawing Sheets

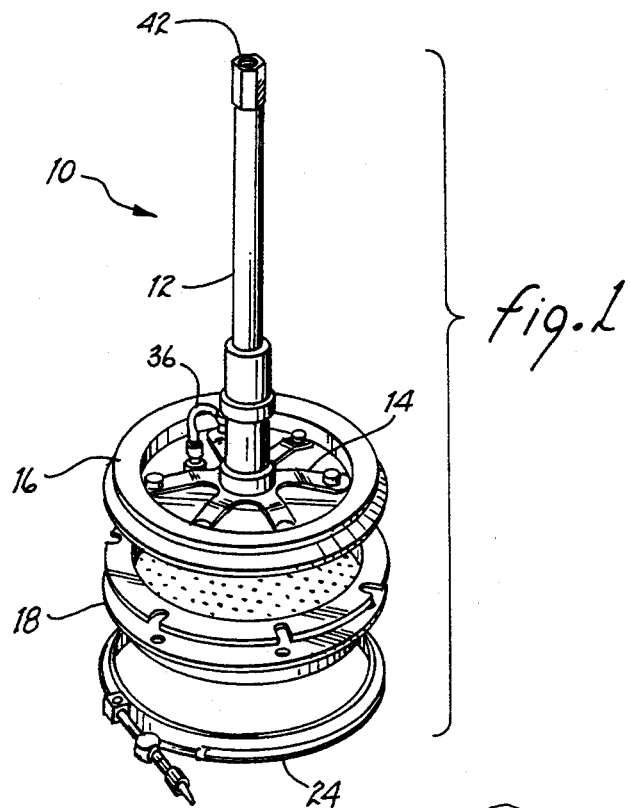
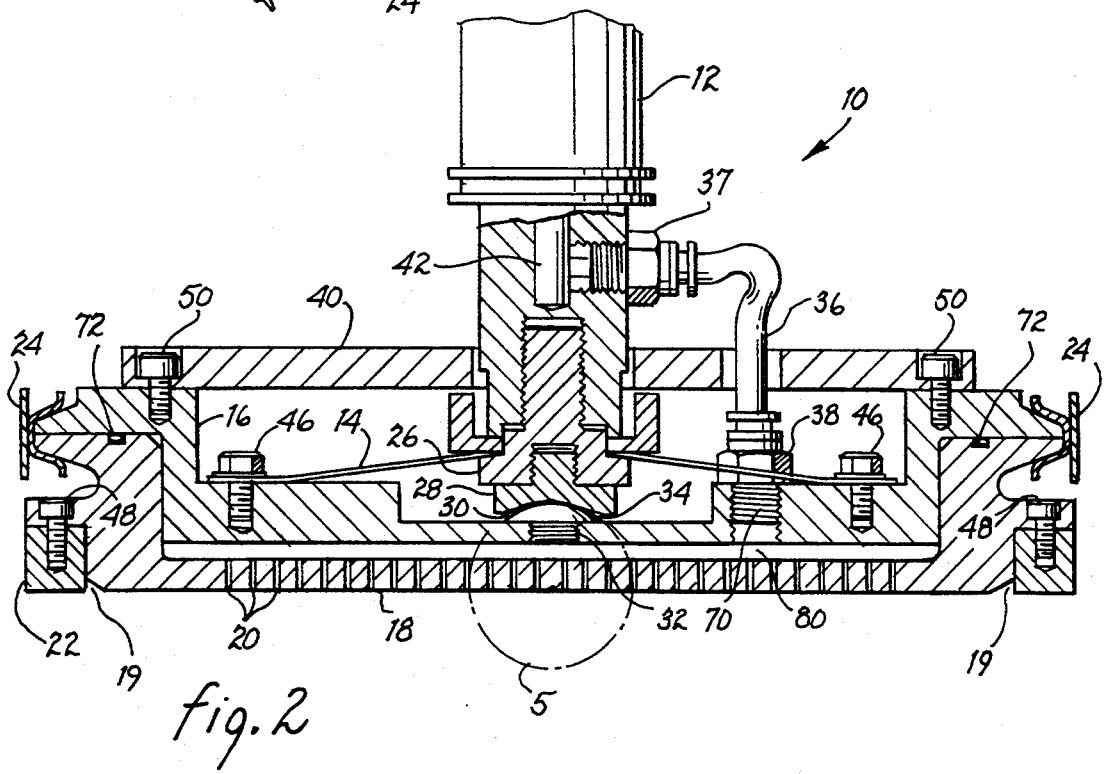

SEMICONDUCTOR WAFER CARRIER AND METHOD

BACKGROUND OF THE INVENTION

1. Field of the Invention

This invention generally relates to semiconductor processing equipment, and more specifically relates to an improved semiconductor wafer carrier for holding a semiconductor wafer during processing.

2. Description of the Related Art

Semiconductor wafers must be polished to achieve a smooth, flat finish before performing process steps that create circuitry on the wafer. This is accomplished by securing a wafer to a wafer carrier, rotating the wafer carrier, and placing a counter-rotating polishing platen in contact with the rotating wafer.

The prior art wafer carrier is fixedly mounted on a shaft, requiring the wafer carrier and polishing platen to be aligned to be perfectly parallel. The prior art wafer carrier provides vacuum pressure through the shaft, and the shaft is coupled to the wafer carrier through three O-rings to maintain vacuum integrity through the connection. The prior art wafer carrier typically has 16 holes which are coupled to the vacuum source. These holes are in a fixed configuration and serve to secure the wafer to the wafer carrier by vacuum pressure. In addition, the prior art wafer carrier is difficult to install and remove, requiring a significant amount of time to change the configuration of the wafer carrier.

An additional problem found in prior art wafer carriers is referred to by those skilled in the art as the edge effect. In general, the undesirable result of the edge effect is that an outer ring of the polished side of the wafer has non-uniform material removal, and therefore, that portion of the wafer is not usable. Of course, this wasted portion may reduce the cost effectiveness of the final product, so it is desirable to alleviate the edge effect in order to maximize the usable area of the wafer. The edge effect is caused by the force of the platen as it meets the outer edge of the wafer and the resultant oscillations of the platen against the wafer. As a result of this force, a first outermost ring portion of the outer ring is characterized by excessive material removal, or a low area on the wafer surface. A second ring portion located adjacent to the first outermost ring portion and toward the center of the wafer is characterized by reduced material removal, or a high area on the wafer surface. A third ring portion located adjacent to the second outermost ring portion and toward the center of the wafer is characterized by excessive material removal, or a low area on the wafer surface. In short, the non-uniform material removal of the outer ring has a pattern which oscillates between excessive material removal and reduced material removal. The outer most ring portion typically experiences the greatest material removal due to the higher force experienced at the physical interface between the wafer edge and the platen. The next ring portion experiencing the reduced material removal is the result of the flexibility of the platen as it springs away from the wafer surface after being compressed by the initial contact with the outer edge surface of the wafer. Subsequently, the platen springs back toward the surface of the wafer to result in the third ring portion experiencing excessive material removal. Of course, this action happens over a short period of time, but since it occurs on a recurring basis as the polishing process continues, the edge effect causes the uneven material removal to occur over an outer ring portion adjacent to the edge and on the polished surface of the wafer. Prior art wafer carriers provided no volume into which the outer portion of the wafer could be bent due to the initial force, and the subsequent oscillations of the platen, thereby resulting in the edge effect.

Therefore, there existed a need for an improved semiconductor wafer carrier and method that provides a gimballing feature which causes the wafer carrier to self-adjust during polishing, which simplifies vacuum connections between the shaft and the wafer carrier, which has a large number of vacuum holes which can be custom-configured to accommodate a large number of process variations, which is easy to install and remove, and which removes the detrimental edge effect.

SUMMARY OF THE INVENTION

An improved semiconductor wafer carrier in accordance with the present invention has a gimballing feature which allows the plane of rotation of the semiconductor wafer to be dynamically changed. This allows the wafer carrier to dynamically adjust during polishing to assure the wafer is in full contact with the polishing platen.

A rotating shaft is provided which has a torque plate coupled thereto. The torque plate is in a hub-and-spoke configuration, with the spokes being spring fingers which are coupled to a drive plate. The spring action of the spring fingers cause a friction fit between a spherical button mounted on the drive plate and a conical receptacle mounted on the rotating shaft. The gimballing motion is achieved by sliding the spherical button within the conical receptacle. This changes the plane of rotation of the drive plate and, hence, the semiconductor wafer coupled to the semiconductor wafer carrier. In this manner the alignment between the semiconductor wafer carrier and the polishing platen need not be precisely parallel, o since the gimballing feature of the semiconductor wafer carrier can adjust for small variations from parallel. Additionally, the carrier plate which carries the wafer is provided with a cavity around the perimeter thereof in order to permit the wafer to be moved toward the cavity, thereby providing means for reducing the edge effect.

The foregoing and other features and advantages will be apparent from the following description of the preferred exemplary embodiment of the invention as illustrated in the accompanying drawings.

BRIEF DESCRIPTION OF THE DRAWINGS

The preferred exemplary embodiment of the present invention will hereinafter be described in conjunction with the appended drawings, where like designations denote like elements, and:

FIG. 1 is a partial exploded view of the semiconductor wafer carrier in accordance with the present invention.

FIG. 2 is a cross sectional view of the semiconductor wafer carrier of FIG. 1 along the axis of rotation.

DETAILED DESCRIPTION OF A PREFERRED EXEMPLARY EMBODIMENT

Figure 4:
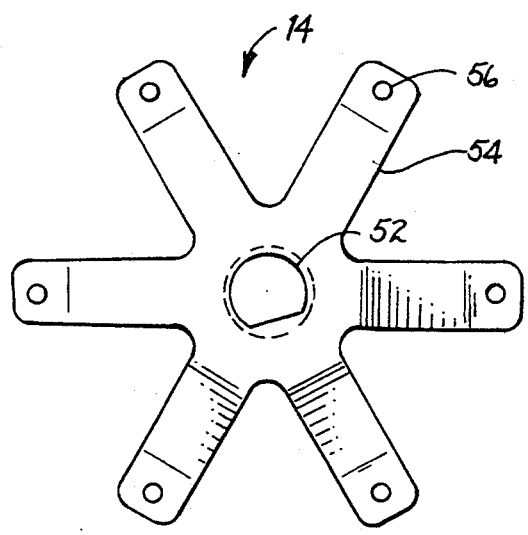
FIG. 4 is a top view of the torque plate of FIG. 3.

Referring to the figures, an improved semiconductor wafer carrier 10 in accordance with the present invention is shown in FIG. 1, and comprises a shaft 12, a torque plate 14, a drive plate 16, a carrier plate 18, and a v-band connector 24. FIG. 2 shows the more detailed view of these components. Shaft 12 has a passage 42 through which vacuum pressure is provided. Shaft 12 has internal threads as shown to allow a retaining bolt 26 to hold torque plate 14 in place. Retaining bolt 26 also has internal threads which allow a conical receptacle 28 to be screwed into place. Torque plate 14 has a hub-and-spoke configuration, as shown in FIGS. 1 and 4, and is attached to drive plate 16 with screws 46 as shown in FIG. 2. Carrier plate 18 is connected to drive plate 16 using v-band connector 24 and an O-ring gasket 72. This method of connection assures a gas-tight connection between drive plate 16 and carrier plate 18, assuring that vacuum pressure is maintained between the two. Gasket 72 is placed in a notch within carrier plate 18 as shown, which typically has a square or rectangular cross section, allowing ample room for gasket 72 to compress when drive plate 16 is coupled to carrier plate 18 using v-band connector 24.

Carrier plate 18 has vacuum holes 20 on its face. The number of holes in this specific embodiment is typically 85 rather than the 16 of the prior art. Through these vacuum holes 20 a vacuum is provided to hold a wafer securely in place. Passage 42 within shaft 12 provides a vacuum source, and is coupled to a vacuum conduit 36 via a quick connect connector 37. Vacuum conduit 36 is then coupled to drive plate 16 via a quick connect connector 38. These quick connect connectors 37 and 38 eliminate the need for multiple o-ring connections between shaft 12 and drive plate 16, and provide a convenient way of easily connecting and disconnecting the vacuum source in shaft 12 from drive plate 16. Drive plate 16 has a vacuum passage 70 which couples the vacuum pressure from the vacuum conduit 36 to a gap 80 between drive plate 16 and carrier plate 18. The vacuum pressure in gap 80 causes vacuum pressure through vacuum holes 20 due to the gas-tight connection between drive plate 16 and carrier plate 18 provided by v-band connector 24 and gasket 72.

A non-metallic retaining ring 22 is coupled to carrier plate 18 using screws 48 as shown. Retaining ring 22 extends below the carrier plate 16 as shown, nominally about 0.008 inch, and thus provides a non-metallic contact area for a wafer coupled to the semiconductor wafer carrier 10. Also, the carrier plate 18 is provided with a cavity 19 having a substantially triangular cross-section. This cavity 19 runs along the perimeter of the carrier plate 18. Thus, when an outer portion of a wafer is forced up toward the carrier plate 18, such as when the edge effect is occurring, the cavity 19 provides a volume for receiving the outer portion of the moving wafer. By providing a volume into which the outer portion of the wafer can move when the outer edge of the wafer is met by the polishing platen, the detrimental results of the edge effect are avoided.

A spherical button 32 is screwed into drive plate 16 as shown, and has a convex spherical surface 34. Torque plate 14 provides a spring force which presses the convex spherical surface 34 of spherical button 32 against a concave conical face 30 of conical receptacle 28. The combination of torque plate 14, conical receptacle 28, and spherical button 32 provide the gimballing motion of the semiconductor wafer carrier 10 of the present invention.

A cover plate 40 is shown in FIG. 2, which is not included in FIG. 1 to allow a clear view of how torque plate 14 is coupled to drive plate 16. Cover plate 40 is nominally a plastic piece which is coupled to drive plate 16 with screws 50. Cover plate 40 prevents exposure of torque plate 14, conical receptacle 28, and spherical button 32 to contaminants and interference from outside sources. Note that cover plate 40 typically has a center hole through which shaft 12 passes, and a second hole through which vacuum conduit 36 passes, as shown in FIG. 2.

Figure 3:
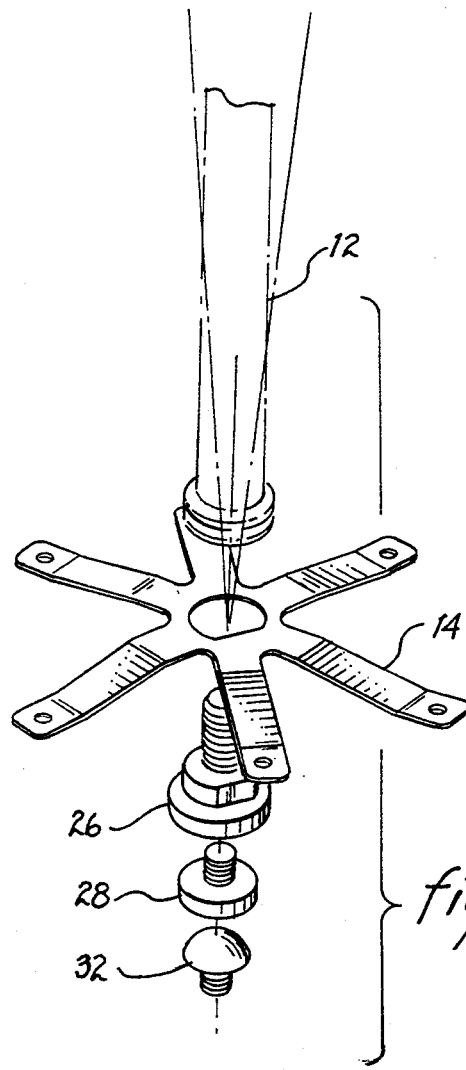
FIG. 3 is an exploded view showing the connection of the torque plate and conical receptacle to the rotating shaft.

FIGS. 3 and 4 show the details of connecting torque plate 14 to shaft 12. As shown in FIG. 4, torque plate 14 has a keyed hole 52, and multiple spring fingers 54 extending radially from keyed hole 52. Each spring finger 54 has a hole 56 through which screws 46 are passed to attach torque plate 14 to drive plate 16, as shown in FIG. 2. As shown in FIG. 3, retaining bolt 26 has a keyed shoulder portion which passes through the keyed hole 52 of torque plate 14, holding torque plate 14 firmly in place once retaining bolt 26 is screwed into and secured to shaft 12. Conical receptacle 28 is then screwed into retaining bolt 26.

Figure 5:
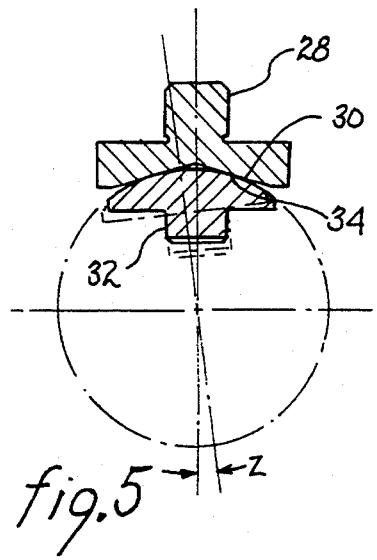
FIG. 5 is a cross sectional view of the conical receptacle and the spherical button of FIG. 1, showing the gimballing motion of the connection shown as circular area 5 of FIG. 1.

FIG. 5 shows the gimballing motion provided by conical receptacle 28 and spherical button 32. When no force is acting on the semiconductor wafer carrier 10, the nominal resting position of spherical button 32 within conical receptacle 28 results in an exact circular contact area between the concave conical portion 30 of conical receptacle 28 and the convex spherical portion 34 of spherical button 32. This nominal resting position results in the plane of the semiconductor wafer carrier being precisely normal to the axis of rotation of shaft 12.

When a force such as a polishing platen is applied to a semiconductor wafer held by the semiconductor wafer carrier 10, the gimballing motion allows semiconductor wafer carrier 10 to adjust its plane of rotation to exactly match the plane of rotation of the polishing platen. This is shown by the shifting of spherical button 32 by angle z as shown in FIG. 5.

Referring again to FIG. 2, v-band connector 24 allows a simple connection between drive plate 16 and carrier plate 18, allowing an operator to easily change carrier plate 18 as required for different applications, reducing machine setup times. The 85 vacuum holes 20 within carrier plate 16 may be left open or may be plugged with screws to provide a custom configuration of vacuum holes 20, as required by the specific application. The combination of the v-band connector 24 and the capability to custom configure the vacuum holes 20 in many different carrier plates 18 allows an operator to have a stock of several differently configured carrier plates 18 on hand, and to quickly and easily remove one carrier plate 18 from the semiconductor wafer carrier 10, and replace it with a different carrier plate 18.

Figure 6:
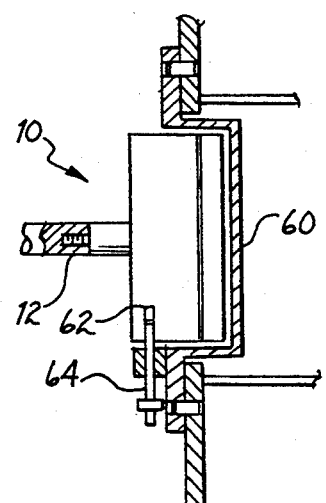
FIG. 6 is a cross sectional view of a second embodiment in accordance with the present invention, wherein the semiconductor wafer carrier may be unscrewed from the rotating shaft.

A second embodiment in accordance with the present invention is disclosed in FIG. 6. The v-band connector 24 of FIGS. 1 and 2 provides a quick and easy way to disconnect carrier plate 18 from drive plate 16 to allow installing a new carrier plate 18 with a hole pattern in a different configuration. In the alternative, the entire semiconductor wafer carrier 10 could be disconnected from shaft 12 by providing a threaded connection on shaft 12. In this manner the semiconductor wafer carrier 10 is held stationary while shaft 12 is rotated, unscrewing semiconductor wafer carrier 10 from shaft 12. The apparatus of FIG. 6 is used to remove semiconductor wafer carrier 10 from shaft 12 in the manner described above. When the semiconductor wafer carrier 10 needs to be changed, the operator places the carrier 10 into the recess of apparatus 60 as shown. The operator then disconnects the quick connect connections on the vacuum conduit 36, inserts a stop pin 64 into a corresponding stop slot 62 within carrier 10, and spins shaft 12 to unscrew shaft 12 from the carrier 10. In this manner carrier 10 can be replaced in a very short time period, reducing setup times for installing a new configuration of carrier 10.

While the invention has been described in its preferred exemplary embodiment, it is to be understood that the words which have been used are words of description rather than limitation, and that changes may be made within the purview of the appended claims without departing from the true scope and spirit of the invention in its broader aspects.

What is claimed is:

1. A semiconductor wafer carrier comprising, in combination:
    a rotating member;
    a vacuum source provided through at least one passage within the rotating member;
    a torque plate coupled to the rotating member in a plane substantially normal to the axis of rotation of the rotating member;
    a drive plate coupled to the torque plate;
    a conical receptacle coupled to the rotating member and having a concave conical portion positioned on the axis of rotation of the rotating member;
    a spherical button fixedly coupled to the drive plate, and having a convex spherical portion coupled by friction to the concave conical portion of the conical receptacle; and
    a carrier plate coupled to the drive plate and having a plurality of holes coupled to the vacuum source.

2. The semiconductor wafer carrier of claim 1 further comprising means for coupling the drive plate to the carrier plate.

3. The semiconductor wafer carrier of claim 2 wherein the means for coupling the drive plate to the carrier plate comprising a v-band connector and a gasket.

4. The semiconductor wafer carrier of claim 1 wherein the torque plate comprising a plurality of fingers extending radially outward from the rotating member, the torque plate being coupled to the drive plate near the outermost extreme of each of the plurality of fingers, thereby providing a spring-loaded flexible connection between the rotating member and the drive plate, allowing the spherical button to rotate in the conical receptacle in a gimballing motion, thereby changing the plane of rotation of the drive plate.

5. The semiconductor wafer carrier of claim 1 further comprising vacuum conduit means for connecting the vacuum source in the rotating member to the plurality of holes in the carrier plate.

6. The semiconductor wafer carrier of claim 5 wherein the vacuum conduit means being coupled on one end to the vacuum source in the rotating member, and coupled on the other end to a passage in the drive plate, and wherein the drive plate and carrier plate are coupled in a gas-tight manner defining a gap between the drive plate and the carrier plate which communicates with the passage in the drive plate to provide vacuum pressure through the plurality of holes, through the gap, through the passage in the drive plate, through the vacuum conduit means, to the vacuum source in the rotating member.

7. The semiconductor wafer carrier of claim 1 further comprising a cover plate coupled to the drive plate and having an opening through which the rotating member passes.

8. The semiconductor wafer carrier of claim 1 wherein the carrier plate having circular notch means for receiving an O-ring gasket for assuring the coupling of the drive plate to the carrier plate is gas-tight.

9. The semiconductor wafer carrier of claim 1 wherein the drive plate having circular notch means for receiving an O-ring gasket for assuring the coupling of the drive plate to the carrier plate is gas-tight.

10. The semiconductor wafer carrier of claim 1 further comprising retaining ring means coupled to the carrier plate for providing a non-metallic contact area for a wafer coupled to the semiconductor wafer carrier, said carrier plate having edge effect reducing means comprising a cavity running along a perimeter surface of said carrier plate for permitting a perimeter surface of said wafer to move toward said cavity.

11. The semiconductor wafer carrier of claim 1 further comprising gasket means for assuring the coupling of the drive plate to the carrier plate is gas-tight.

12. The semiconductor wafer carrier of claim 1 further comprising means for plugging at least one of the plurality of holes.

13. The semiconductor wafer carrier of claim 12 wherein said means for plugging at least one of the plurality of holes comprising plugs which can be screwed into each of said plurality of holes.

14. The semiconductor wafer carrier of claim 1 wherein the rotating member having a first portion with internal threads coupled to a source of rotation and having a second portion having external threads coupled to the semiconductor wafer carrier such that the first and second portions are connected together by screwing the second portion into the first portion, and such that the semiconductor wafer carrier can be disconnected from the rotation source by unscrewing the first portion from the second portion.

15. A semiconductor wafer carrier comprising, in combination:
    a rotating member;
    a vacuum source provided through at least one passage within the rotating member;
    a torque plate coupled to the rotating member in a plane substantially normal to the axis of rotation of the rotating member;
    a drive plate coupled to the torque plate;
    a conical receptacle coupled to the rotating member and having a concave conical portion positioned on the axis of rotation of the rotating member;
    a spherical button fixedly coupled to the drive plate, and having a convex spherical portion coupled by friction to the concave conical portion of the conical receptacle;
    a carrier plate coupled to the drive plate with a v-band connector and gasket means for assuring the coupling of the drive plate to the carrier plate is gas-tight, the carrier plate having a plurality of holes coupled to the vacuum source;

vacuum conduit means for connecting the vacuum source in the rotating member to the plurality of holes in the carrier plate;

retaining ring means coupled to the carrier plate for providing a non-metallic contact area for a wafer coupled to the semiconductor wafer carrier;

means for plugging at least one of the plurality of holes comprising plugs which can be screwed into each of said plurality of holes;

the torque plate comprising a plurality of fingers extending radially outward from the rotating member, the torque plate being coupled to the drive plate near the outermost extreme of each of the plurality of fingers, thereby providing a spring-loaded flexible connection between the rotating member and the drive plate, allowing the spherical button to rotate in the conical receptacle in a gimballing motion, thereby changing the plane of rotation of the drive plate; and edge effect reducing means comprising a cavity running along a perimeter surface of said carrier plate for permitting a perimeter surface of said wafer to move toward said cavity.

16. A method for providing a semiconductor wafer carrier comprising the steps of:

providing a rotating member;

providing a vacuum source through at least one passage within the rotating member;

coupling a torque plate to the rotating member in a plane substantially normal to the axis of rotation of the rotating member;

coupling a drive plate to the torque plate;

coupling a conical receptacle to the rotating member, the conical receptacle having a concave conical portion positioned on the axis of rotation of the rotating member;

coupling a spherical button to the drive plate, and placing a convex spherical portion of the spherical button within the concave conical portion of the conical receptacle; and coupling a carrier plate to the drive plate, the carrier plate having a plurality of holes coupled to the vacuum source.

17. The method of claim 16 wherein the coupling of the carrier plate to the drive plate produces a gas-tight connection between the carrier plate and the drive plate.

18. The method of claim 16 wherein the torque plate comprising a plurality of fingers extending radially outward from the rotating member, the torque plate being coupled to the drive plate near the outermost extreme of each of the plurality of fingers, thereby providing a flexible connection between the rotating member and the drive plate, allowing the conical receptacle to rotate upon the spherical button in a gimballing motion, thereby changing the plane of rotation of the drive plate.

19. The method of claim 16 further comprising the step of coupling retaining ring means to the carrier plate for providing a non-metallic contact area for a wafer coupled to the semiconductor wafer carrier and the step of forming an edge effect reducing means comprising a cavity running along a perimeter surface of said carrier plate for permitting a perimeter surface of said wafer to move toward said cavity.

20. The method of claim 16 further comprising the step of plugging at least one of the plurality of holes to obtain a custom configuration of open holes within the carrier plate.

* * * * *